US009927556B2

(12) United States Patent
Cunningham et al.

(10) Patent No.: US 9,927,556 B2
(45) Date of Patent: Mar. 27, 2018

(54) NANOSTRUCTURE MATERIAL METHODS AND DEVICES

(71) Applicants: The Board of Trustees of the University of Illinois, Urbana, IL (US); Rohm and Haas Electronic Materials, LLC, Marlborough, MA (US); Dow Global Technologies LLC, Midland, MI (US)

(72) Inventors: Brian Cunningham, Champaign, IL (US); Gloria G. See, Champaign, IL (US); Peter Trefonas, III, Medway, MA (US); Jieqian Zhang, Southborough, MA (US); Jong Keun Park, Westborough, MA (US); Kevin Howard, Urbana, IL (US); Kishori Deshpande, Lake Jackson, TX (US); Trevor Ewers, Urbana, IL (US)

(73) Assignees: The Board of Trustees of the University of Illinois, Urbana, IL (US); Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 50 days.

(21) Appl. No.: 15/066,863

(22) Filed: Mar. 10, 2016

(65) Prior Publication Data
US 2017/0045643 A1 Feb. 16, 2017

Related U.S. Application Data

(60) Provisional application No. 62/132,767, filed on Mar. 13, 2015.

(51) Int. Cl.
*G02B 1/08* (2006.01)
*G02B 27/28* (2006.01)
(Continued)

(52) U.S. Cl.
CPC ............ *G02B 1/08* (2013.01); *G02B 1/04* (2013.01); *G02B 5/1861* (2013.01); *G02B 5/30* (2013.01);
(Continued)

(58) Field of Classification Search
CPC .......... G02B 1/08; G02B 1/04; G02B 5/1861; G02B 5/30; G02B 5/3025; G02B 27/28; G02F 1/133603; H01L 33/18; H01L 33/50; H01L 33/02; H01L 33/005
USPC ....... 359/352, 485.03, 485.05, 567; 977/755, 977/759, 834; 257/79, 96
See application file for complete search history.

(56) References Cited

U.S. PATENT DOCUMENTS 9,028,123 B2 * 5/2015 Nichol ................ G02B 6/0076
                                                    349/63
9,470,396 B2 * 10/2016 McDaniel ......... H01L 31/02165
(Continued)

FOREIGN PATENT DOCUMENTS

| JP | 2012-103495 A | 5/2012 |
| JP | 2013-544018 A | 12/2013 |
| JP | 2014-535127 A | 12/2014 |

OTHER PUBLICATIONS

International Search Report dated Jul. 25, 2016 in corresponding International Application No. PCT/US2016/021827 (4 Pages).

*Primary Examiner* — Frank Font
(74) *Attorney, Agent, or Firm* — Mintz Levin Cohn Ferris Glovsky and Popeo, P.C.; Peter F. Corless (57) ABSTRACT

In one aspect, structures are provided that comprise (a) a one-dimensional periodic plurality of layers, wherein at least two of the layers have a refractive index differential sufficient to provide effective contrast; and (b) one or more light-emitting nanostructure materials effectively positioned with respect to the refractive index differential interface, wherein the structure provides a polarized output emission.

17 Claims, 3 Drawing Sheets

(51) Int. Cl.
 *G02B 5/30* (2006.01)
 *G02B 1/04* (2006.01)
 *G02B 5/18* (2006.01)
 *H01L 33/58* (2010.01)

(52) U.S. Cl.
 CPC .......... *G02B 5/3025* (2013.01); *G02B 27/28* (2013.01); *H01L 33/58* (2013.01)

(56) References Cited

U.S. PATENT DOCUMENTS

| | | | |
|---|---|---|---|
| 9,478,713 B2* | 10/2016 | Cunningham | H01L 33/50 |
| 2004/0095658 A1* | 5/2004 | Buretea | B82Y 20/00 |
| | | | 359/853 |
| 2007/0230883 A1 | 10/2007 | Hart et al. | |
| 2010/0259826 A1* | 10/2010 | Ji | B82Y 20/00 |
| | | | 359/599 |
| 2011/0007386 A1* | 1/2011 | Lupton | B82Y 15/00 |
| | | | 359/350 |
| 2012/0326056 A1* | 12/2012 | Zhou | B82Y 20/00 |
| | | | 250/459.1 |
| 2014/0009902 A1* | 1/2014 | Banin | G02F 1/133617 |
| | | | 362/19 |
| 2014/0139787 A1 | 5/2014 | Ki et al. | |
| 2015/0076468 A1* | 3/2015 | Yamaguchi | G02B 1/118 |
| | | | 257/40 |
| 2015/0349212 A1* | 12/2015 | Cunningham | H01L 33/02 |
| | | | 257/96 |

\* cited by examiner

NANOSTRUCTURE MATERIAL METHODS AND DEVICES

RELATED APPLICATIONS

This application claims the benefit of priority under 35 U.S.C. § 119(e) to U.S. Provisional Application No. 62/132,767, filed Mar. 13, 2015, which is incorporated herein by reference in its entirety.

FIELD

In one aspect, structures are provided that comprise a) a one-dimensional periodic plurality of layers, wherein at least two of the layers have a refractive index differential sufficient to provide effective contrast; and b) one or more light-emitting nanostructure materials effectively positioned with respect to the refractive index differential interface, wherein the structure provides a polarized output emission.

BACKGROUND

There are a broad range of application-specific needs for lighting and display technologies used in homes, workplaces and consumer products. Lighting and display applications require color purity and tailored control of the optical properties of their output. For example, the directivity or diffusivity of a light source affects user comfort under various lighting conditions and the directionality of light output from displays affects the viewing angle, allowing either privacy or accessibility to groups.

Light emitting diodes (LEDs) are important light sources in many applications such as solid state lighting, back lighting, signaling and displays. As in conventional light sources LEDs are non-coherent and non-polarized light sources, i.e. light does not possess a significant preference for a specific polarization state. However, for certain applications, such as liquid crystal display backlighting, liquid crystal display projection, and liquid crystal beam steering devices in which the light beam emitted by LED point sources is manipulated with liquid crystal cells, the non-polarized light from LEDs must be converted to polarized light through a polarizer so that the next layer of liquid crystal can switch the light from LEDs on and off. The required polarizer adds cost and complexity to such displays.

It would be desirable to have improved light-emitting structures.

SUMMARY

We now provide new light-emitting structures and devices, and methods of making such structures and devices.

In a first aspect, a structure is provided that comprises a) a one-dimensional periodic plurality of layers, wherein at least two of the layers have a refractive index differential sufficient to provide effective contrast; and b) one or more light-emitting nanostructure materials effectively positioned with respect to the refractive index differential interface, wherein the structure provides a polarized output emission.

As referred to herein, nanostructure materials include, among others, quantum dot materials as well as without limitation nanocrystalline nanoparticles, dyes and phosphors. By stating that that the plurality of layers are one-dimensional periodic, it is understood that the nearest neighbor features of a particular layer are spaced equally in one direction along a surface of that layer, but not along the orthogonal direction of that layer.

In a preferred aspect, a structure is provided that comprises a) a one-dimensional polymeric layer comprising one or more polymers, the polymeric layer having a patterned surface comprising a plurality of recesses; b) a layer of a material having a higher index of refraction than the polymeric layer disposed over the patterned surface of the polymeric layer; and c) one or more light-emitting nanostructure materials effectively positioned with respect to the refractive index differential interface of layers a) and b), wherein the structure provides a polarized output emission. Again, by stating that polymeric layer is one-dimensional, it is understood that the nearest neighbor recesses of the polymeric layer are spaced equally in one direction along a surface of the polymeric layer, but not along the orthogonal direction of that polymeric layer.

We have found such a configuration can enable large size structures that have highly polarized emissions.

In a particularly preferred aspect, the one or more light emitting nanostructure materials are configured in one or more linear grating arrangements. In additional preferred aspects, the one-dimensional grating of a structure can be of a variety of configurations other than rectangular, such as a triangular grating, sinusoidal grating and others.

In preferred structures and devices, the light emitting nanostructure materials are positioned sufficiently close to the photonic structure so that the emission of the light emitting nanostructure materials is substantially or completely coupled to the resonance mode of the photonic crystal to thereby achieve substantial, and even 100%, polarized control. For instance, in preferred structures and devices, the light emitting nanostructure materials may be positioned within or close to (e.g., 0.5, 0.4, 0.3, 0.2, 0.1 microns or less) the photonic crystal structure to thereby enable enhanced polarization. Preferred structures also may comprise two or more different light emitting nanostructure materials, e.g. two or more different quantum dots, such as to enable the structure to provide multiple wavelength emissions.

Preferred structures and devices of the invention can provide a substantially polarized emission, e.g. where at least 60%, 70%, 80%, 90% or even up to about 100% of the light emitted from the structure or device is polarized.

In certain preferred aspects, structures and devices of the invention can provide a linearly polarized light output. In other aspects, structures and devices of the invention can provide a circular or elliptically polarized light output.

Particularly preferred structures of the invention also can provide significantly enhanced energy efficiency. In this regard, the present light-emitting structures and devices can provide a polarized output without the use of a separate polarizer device. For example, a structure of the invention configured as a display device that utilizes a polarized backlight can provide significantly enhanced energy efficiency by obviating any need for a polarizing filter, i.e. a display device of the invention that does not require a polarizing filter can gain the optical power that would be otherwise lost through the polarizing filter.

In certain aspects, preferred structures of the invention can provide an output emission that is increased relative to a control structure, e.g. increased by 40, 50, 100, 200, 300, 400, 500, 600, 700, 800 percent or more. A control structure would be comparable to a structure of the invention and contain the same polymeric layer and light-emitting nanostructure materials and configuration thereof as the structure of the invention, but the control structure would not contain a one dimensional periodic plurality of layers and/or a refractive index differential between the layers.

In a yet further aspect, methods are provided for forming a photonic crystal system that include applying on a substrate surface a polymeric layer comprising a polymer and a plurality of nanocrystals; disposing a layer of a material having a higher index of refraction than the polymeric layer over the polymeric layer to provide a photonic crystal system, wherein the photonic crystal system provides a polarized output emission We have found that in such methods one or more layers or materials of a structure may be preferably applied on a substrate by deposition of controlled amounts of materials, including by electrohydrodynamic-jet (E-jet) printing, ink jet printing, transfer printing and spin coating, among others. Preferably, the polymeric layer is discretely applied on a substrate surface. By stating herein a material is discretely applied, it is intended to embrace an application method involving deposition of a controlled amount of material, including in particular E-jet printing, ink-jet printing and transfer printing.

We have found that E-jet printing can enable targeted placement of nanostructure materials in desired close proximity of a photonic crystal grating thereby minimizing emissions of the nanostructure materials outside the resonant evanescent field volume. This can enable a highly polarized output emission, due to the significantly higher enhancement present for photons oriented to interact with the transverse magnetic (TM) or transverse electric (TE) mode of the photonic crystal.

In preferred methods, a polymeric layer may be deposited onto a molding master substrate to define device features. After deposition on such a molding substrate, the polymeric layer may be removed from the substrate and the removed polymeric layer transferred to a distinct substrate. Suitably, after deposition onto a molding substrate or other substrate, the polymeric layer may cured such as by thermal treatment.

One or more nanostructure materials may be positioned within a variety of structure locations. Suitably, one or more nanostructure materials are positioned proximate to the refractive index differential interface of the structure to thereby provide an effective emission output. For instance, one or more nanostructure materials may be a component of one or more polymeric or other layers of a structure of the invention. More particularly, in a structure as disclosed here in that comprises a) a polymeric layer comprising one or more polymers and the polymeric layer having a patterned surface comprising a plurality of recesses; b) a layer of a material having a higher index of refraction than the polymeric layer disposed over the patterned surface of the polymeric layer, one or more light-emitting nanostructure materials may be suitably a component of either or both the polymeric layer or the higher refractive index layer disposed over the polymeric layer.

The invention also provides devices obtained or obtainable by the methods disclosed herein, including a variety of light-emitting devices, photodetectors, chemical sensors, photovoltaic device (e.g. a solar cell), transistors and diodes, as well as biologically active surfaces that comprise the systems disclosed herein.

As used herein, the terms "a", "an", and "the" include plural forms unless the context clearly dictates otherwise. Thus, "a", "an", and "the" each refer to "one or more" unless the context clearly dictates otherwise.

Unless specifically stated or obvious from context, as used herein, the term "or" is understood to be inclusive.

Other aspects of the invention are disclosed infra.

BRIEF DESCRIPTION OF THE DRAWINGS

FIG. 4 shows polarized output from the photonic crystal in FIG. 4(a) (TM polarization measured) and FIG. 4(b) (TE polarization measured).

DETAILED DESCRIPTION

We have now demonstrated precise placement of quantum dots within specific regions of replica molded photonic crystals. The devices can exhibit polarized emission and substantial increase in output intensity, as compared to output without the photonic crystal (PC) structure. These improvements have the potential to eliminate polarizers from backlight display technology and substantially increase optical efficiency.

Preferred structures of the invention include one or more one-dimensional photonic crystals that comprise a plurality of layers, wherein at least two of the layers have a refractive index differential sufficient to provide effective contrast; and one or more light-emitting nanostructure materials effectively positioned with respect to the refractive index differential interface, wherein the structure provides a polarized output emission.

As discussed above, in particularly preferred aspects, one or more light-emitting nanostructure materials are configured in one or more linear gratings. Such a configuration can be provided such as by use of a replica template molding substrate as disclosed herein, or by other method, such as an additive construction as generally disclosed in WO2005/112210.

Preferred structures also may comprise a plurality of linear gratings or a plurality of gratings of other configurations such as triangular or sinusoidal gratings such as to adjust wavelength or angular dispersion of the emission. Gratings of such a plurality for example may differ in pitch.

In certain preferred aspects, structures and devices of the invention can provide a linearly polarized light output. In other aspects, structures and devices of the invention can provide a circular or elliptically polarized light output. A circular polarized light output can be provided by addition of a quarter-wave plate or filter to a structure or device as disclosed herein. A top coating layer of a structure or device can function as a quarter wave filter to provide a circular polarized light output. Similarly, an elliptically polarized light output can be provided by addition of an appropriate plate or filter to a structure or device as disclosed herein.

Figures 1A, 1B:
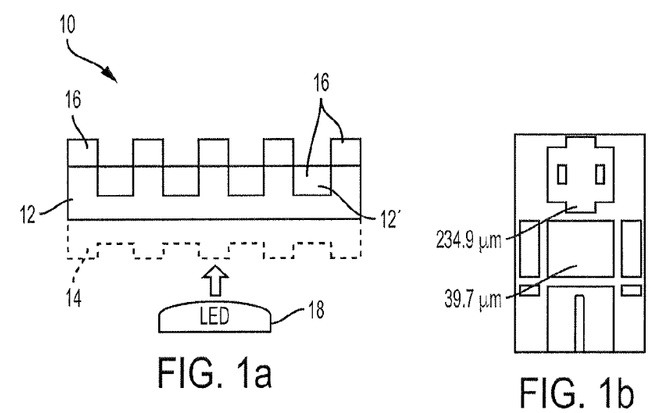
FIG. 1(a) shows an exemplary device according to the present invention.
FIGS. 1(b) and (c) are scanning electron micrographs (SEMs) of a molding master template structure useful in processes of the invention.

Referring now to the drawings, FIG. 1(a) is a schematic of a device structure 10 that includes polymeric layer 12 on substrate 14 with layer 16 having a differing index of refraction than layer 12 disposed above layer 12.

Polymeric layer 12 suitably may comprise one or more light-emitting nanostructure materials. For instance, a preferred material of layer 12 is a polymer embedded with light-emitting quantum dots. Layer 12 suitably is replica molded on a molding substrate as further discussed below with respect to FIG. 1(d).

Layer 16 provides a refractive index differential with respect to layer 12 to thereby provide sufficient contrast. Thus, layer 16 may have a refractive index that is lower than the refractive index of layer 12, or layer 16 may have a refractive index that is higher than the refractive index of layer 12. For at least certain applications, preferred materials for the layer 16 include titanium dioxide ($TiO_2$) or other suitable high refractive index inorganic oxide. The layer 16 can be deposited by coating (e.g., spin coating, spray coating, dip coating), sputtering, or other methods for depositing a layer of material on the polymeric layer without disturbing the patterning of the polymeric layer. The thickness of the layer 16 can be used to tune the resonant wavelength of the periodic recesses. When the layer 16 is $TiO_2$, a suitable thickness is from about 50 nm to about 500 nm.

Light source 18 shown in FIG. 1(a) can be any suitable source of ultraviolet (UV) or visible light, e.g., light in the range of 200 nm<$\lambda$<700 nm including an LED.

Substrate 14 can be made of any rigid or flexible material, suitably a material that is optically transparent in a desired wavelength range. For example, the substrate can be made of glass, cellulose acetate, or polymeric materials such as polyethylene terephthalate, polyimides, polycarbonate, polyurethane, and the like. The substrate can have any suitable thickness, for example, from 1 micron to 1 mm in thickness.

The one or more of the polymers of layer 12 can be selected from any suitable polymeric material, including polyethylene terephthalate, polyimides, polycarbonate, polyurethane, and the like. Preferred polymeric materials include lauryl methacrylate (LMA), ethyl glycol dimethacrylate (EGDMA) and mixtures thereof. The polymer layer can optionally be adhered to the substrate with an optically transparent adhesive such as NOA 61 (Norland Products, Inc.).

Polymer layer 12 suitably can be patterned, e.g. the layer 12 may comprise a plurality of recesses 12'. Recesses as referred herein can comprise periodic structures having a variety of configurations such as linear prisms, elongated ridges, and linear gratings. In a patterned region, preferably a plurality of recesses has periodicity, e.g., the plurality of recesses are spaced equally or other regular or repeating arrangement along a specified dimension on the surface. The plurality of recesses can be formed integrally with the polymeric layer, e.g., by coating a polymer solution onto a patterned master template. Alternatively, the plurality of recesses can be formed by first forming a substantially flat or planar polymer layer on the substrate, and then patterning the polymeric layer, e.g., by stamping with a patterned die. In a further alternative, microstructures such as ridges, lenslets, pyramids, trapezoids, round or square shaped posts, or curved sided cone structures (see, e.g., U.S. Patent Application 2010/0128351) are formed or applied on the polymer layer by deposition of a material on the surface of the polymeric layer, thereby defining the plurality of recesses on the polymeric layer.

The recesses can suitably be integrally formed with the substrate or in a layer applied to the substrate. For instance, the recesses can be formed on the substrate by applying to the substrate a coating layer and subsequently patterning the applied layer.

As discussed, the recesses suitably are one-dimensional, where the recesses are periodic in only one dimension, i.e., nearest-neighbor features are spaced equally in one direction along the surface, but not along the orthogonal direction. In the case of one-dimensional periodic recesses, the spacing between adjacent periodic features suitably is less than 1 micron. As discussed above, one-dimensional structures of a variety of configurations may be utilized including, for example, lenslets, pyramids, trapezoids, round or square shaped posts, continuous or elongated prisms or ridges, or linear gratings.

The spacing of recesses can be selected in conjunction with a structure's refractive index differential to produce resonances at a selected wavelength. Rigorous coupled wave analysis can be used to predict the resonant wavelengths and electromagnetic field distributions at the resonant wavelengths for a given spacing or recesses. Thus, for example, for certain structures, recesses having a spacing of 250 nm can provide a resonance at 490 nm, while recesses having a spacing of 340 nm can provide a resonance at 590 nm. A structure's recess spacing in combination with that structure's refractive index differential will provide a particular resonant wavelength.

In certain embodiments, the polymeric layer comprises a plurality of first regions and a plurality of second regions. The plurality of first and second regions can be arranged on the substrate in any desired pattern, such as a checkerboard pattern. In certain embodiments, the first and second regions are in an alternating relationship to each other.

As discussed above, in the present structures and methods, polymer layers, nanostructure materials, other layers such as a layer having a differing refractive index may be applied by a variety of deposition methods including E-jet printing, ink-jet printing, transfer printing and spin coating, among others. For producing at least certain structures, E-jet printing may be preferred. E-jet printing in general utilizes a voltage difference between a printing nozzle and the substrate to which material is to be deposited. Preferred E-jet printing procedures are also described in Example 1 which follows, where a polymer containing a quantum dot solution was E-jet printed over a specified region for replica molding. E-jet printing protocols are also disclosed in U.S. Pat. No. 8,562,095 and US 2011/0187798.

Briefly, E-jet printing uses electric fields, rather than the traditional thermal or acoustic-based ink jet systems, to create fluid flows to deliver material to a substrate. An E-jet printing system can involve establishing an electric field between a nozzle containing material to be deposited (e.g. a polymer solution) and the substrate to which the material is to be transferred. In certain suitable systems, this can be accomplished by connecting each of a platen and the nozzle to a voltage power supply, and resting an electrically conductive substrate against the platen. A voltage pulse is created between the platen and the nozzle, creating a distribution of electrical charge on the material to be deposited. At a voltage pulse that exceeds a threshold voltage, the electric field causes a jet of material to flow from the nozzle onto the substrate, either in the form of a continuous stream or a sequence of discrete droplets.

As discussed above, the term "nanostructure material", as used herein, includes quantum dot materials as well as nanocrystalline nanoparticles (nanoparticles or nanocrystals) that comprise one or more heterojunctions such as heterojunction nanorods. Nanostructure materials, including nanocrystals and quantum dots, embrace semiconductor materials having a nanocrystal structure and sufficiently small to display quantum mechanical properties. See U.S.

Published Application 2013/0056705 and U.S. Pat. No. 8,039,847. See also US 2012/0234460 and US 20130051032. Nanostructure materials also may include fluorescent dyes and phosphors including upconverting phosphors.

A quantum dot suitably may be Group II-VI material, a Group III-V material, a Group V material, or a combination thereof. The quantum dot suitably may include e.g. at least one selected from CdS, CdSe, CdTe, ZnS, ZnSe, ZnTe, HgS, HgSe, HgTe, GaN, GaP, GaAs, InP and InAs. Under different conditions, the quantum dot may include a compound including two or more of the above materials. For instance, the compound may include two or more quantum dots existing in a simply mixed state, a mixed crystal in which two or more compound crystals are partially divided in the same crystal e.g. a crystal having a core-shell structure or a gradient structure, or a compound including two or more nanocrystals. For example, the quantum dot may have a core structure with through holes or an encased structure with a core and a shell encasing the core. In such embodiments, the core may include e.g. one or more materials of CdSe, CdS, ZnS, ZnSe, CdTe, CdSeTe, CdZnS, PbSe, AgInZnS, and ZnO. The shell may include e.g. one or more materials selected from CdSe, ZnSe, ZnS, ZnTe, CdTe, PbS, TiO, SrSe, and HgSe.

Passivated nanocrystalline nanoparticles (nanoparticles) that comprise a plurality of heterojunctions suitably facilitate charge carrier injection processes that enhance light emission when used as a device. Such nanoparticles also may be referred to as semiconducting nanoparticles and may comprise a one-dimensional nanoparticle that has disposed at each end a single endcap or a plurality of endcaps that contact the one-dimensional nanoparticle. The endcaps also may contact each other and serve to passivate the one-dimensional nanoparticles. The nanoparticles can be symmetrical or asymmetrical about at least one axis. The nanoparticles can be asymmetrical in composition, in geometric structure and electronic structure, or in both composition and structure. The term heterojunction implies structures that have one semiconductor material grown on the crystal lattice of another semiconductor material. The term one-dimensional nanoparticle includes objects where the mass of the nanoparticle varies with a characteristic dimension (e.g. length) of the nanoparticle to the first power. This is shown in the following formula (1): M $\alpha$ Ld where M is the mass of the particle, L is the length of the particle and d is an exponent that determines the dimensionality of the particle. Thus, for instance, when d=1, the mass of the particle is directly proportional to the length of the particle and the particle is termed a one-dimensional nanoparticle. When d=2, the particle is a two-dimensional object such as a plate while d=3 defines a three-dimensional object such as a cylinder or sphere. The one-dimensional nanoparticles (particles where d=1) includes nanorods, nanotubes, nanowires, nanowhiskers, nanoribbons and the like. In one embodiment, the one-dimensional nanoparticle may be cured or wavy (as in serpentine), i.e. have values of d that lie between 1 and 1.5. Exemplary preferred materials are disclosed in U.S. Pat. No. 8,937,294, incorporated herein by reference.

The one-dimensional nanoparticles suitably have cross-sectional area or a characteristics thickness dimension (e.g., the diameter for a circular cross-sectional area or a diagonal for a square of square or rectangular cross-sectional area) of about 1 nm to 10000 nanometers (nm), preferably 2 nm to 50 nm, and more preferably 5 nm to 20 nm (such as about 6, 7, 8, 9, 10, 11, 12, 13, 14, 15, 16, 17, 18, 19 or 20 nm) in diameter. Nanorods are suitably rigid rods that have circular cross-sectional areas whose characteristic dimensions lie within the aforementioned ranges. Nanowires or nanowhiskers are curvaceous and have different or vermicular shapes. Nanoribbons have cross-sectional area that is bounded by four or five linear sides. Examples of such cross-sectional areas are square, rectangular, parallelopipeds, rhombohedrals, and the like. Nanotubes have a substantially concentric hole that traverses the entire length of the nanotube, thereby causing it to be tube-like. The aspect ratios of these one-dimensional nanoparticles are greater than or equal to 2, preferably greater than or equal to 5, and more preferably greater than or equal to 10.

The one-dimensional nanoparticles comprise semiconductors that suitably include those of the Group II-VI(ZnS, ZnSe, ZnTe, CdS, CdTe, HgS, HgSe, HgTe, and the like) and III-V (GaN, GaP, GaAs, GaSb, InN, InP, InAs, InSb, AlAs, AlP, AlSb, and the like) and IV (Ge, Si, Pb and the like) materials, an alloy thereof, or a mixture thereof.

Nanostructure materials including quantum dot materials are commercially available and also may be prepared for example by a standard chemical wet method using a metallic precursor as well as by injecting a metallic precursor into an organic solution and growing the metallic precursor. The size of the nanostructure material including quantum dot may be adjusted to absorb or emit light of red (R), green (G), and blue (B) wavelengths. Thus, a light-emitting nanocrystal may be selected to absorb or emit light of a selected wavelength or wavelength range.

The light-emitting nanostructure materials such as nanocrystals or quantum dots can be incorporated into the polymer layer by addition of a suspension or solution of the nanostructure materials (e.g. nanocrystals or quantum dots) to a monomer solution, followed by discrete application of the polymer solution onto the substrate and curing of the polymer solution to provide the polymer with embedded nanocrystals or quantum dots.

The following examples are illustrative of the invention.

EXAMPLE 1

The photonic crystal structure, shown in FIG. 1(a) includes of a replica-molded grating formed by a polymer doped with quantum dots, covering a transparent plastic substrate. A high refractive index layer of TiO$_2$ (t=105 nm) is deposited over the surface of the polymer grating to create periodic variation in the refractive index of the device in the direction lateral to the surface. The grating, shown in the SEM of the silicon replica molding master in FIG. 1(c), has a pitch of 340 nm with a 67% duty cycle and a depth of 120 nm.

The structure of the device includes several discrete photonic crystal regions arranged to form a block figure, shown in the SEM of the device in FIG. 1(b). The photonic crystal regions may be for example as small as 40 µm or less, but up to 320 µm or more, on a side. It is also possible for the device to include regions that contain another distinct grating structure in which the photonic crystal grating may run either parallel or perpendicular to the grating of the other regions.

Figure 2:
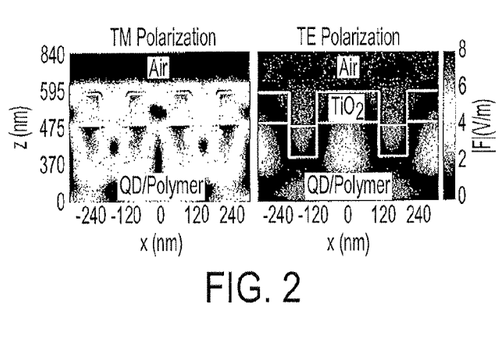
FIG. 2 shows field distributions of two periods of the photonic crystal simulated using finite-difference time-domain analysis under excitation at $\lambda$=613 nm by TM (left) and TE (right) polarizations.

The photonic crystals were designed with the aid of electromagnetics simulation software (Lumerical FDTD) to determine the photonic crystal dimensions necessary for a structure with transverse magnetic (TM) polarized resonance conditions that overlap with quantum dot emission at one selected wavelength in the visible region of the spectrum ($\lambda$=575 nm) as a demonstration. Simulations were performed using the refractive index values across the visible spectra, but with particular interest at the target wavelength λ=575 nm, using the refractive index values of TiO$_2$ (n=2.625) and the UV curable polymer (n=1.524, Woolam VAS Ellipsometer). Both the TM and transverse electric (TE) polarizations at λ=575 nm excitation were modeled and a comparison of the electric field intensity is shown in FIG. 2. The simulations show a clear difference in the intensity of the grating cross sections under the different polarization conditions.

Figure 1C:
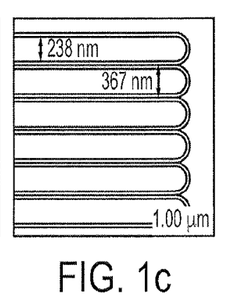

To fabricate the devices, a replica molding master, shown in FIGS. 1(b) and 1(c), was patterned using electron beam lithography on a silicon wafer with a layer of thermally grown SiO$_2$. Reactive ion etching (PlasmaLab Freon/O2 Reactive Ion Etcher System) was then used to etch the 120 nm deep trenches for the grating. The master was cleaned with piranha etch and coated with 1H,1H,2H,2H-Perfluorooctyltrichlorosilane (No-Stick from Alfa Aesar) before the polymer was applied by electrohydrodynamic jet (E-jet) printing onto the surface.

The state of the silicon surface has a large impact on the quality of the printing process. If the wafer surface is too hydrophobic, the printed droplets scatter instead of forming continuous lines. If the surface is too hydrophilic, the cured polymer is difficult to delaminate from the master. The use of No-Stick provides the appropriate hydrophobicity for repeatable E-jet printing.

To prepare the quantum dot-doped polymer solution, two monomers, 91 μL of Lauryl methacrylate (LMA, Sigma-Aldrich) and 9 μL of ethylene glycol dimethacrylate (EGDMA, Sigma-Aldrich) were mixed in a flask, followed by the addition of 4 mL of CdSeS/ZnS alloyed quantum dots in a toluene solution (Sigma-Aldrich). The remaining solvent was evaporated using a rotary evaporator and then 1 v % Darocur 1173 (Sigma-Aldrich) initiator was added to the mixture. The resulting quantum dot—LMA solution was used for printing.

Figure 1D:
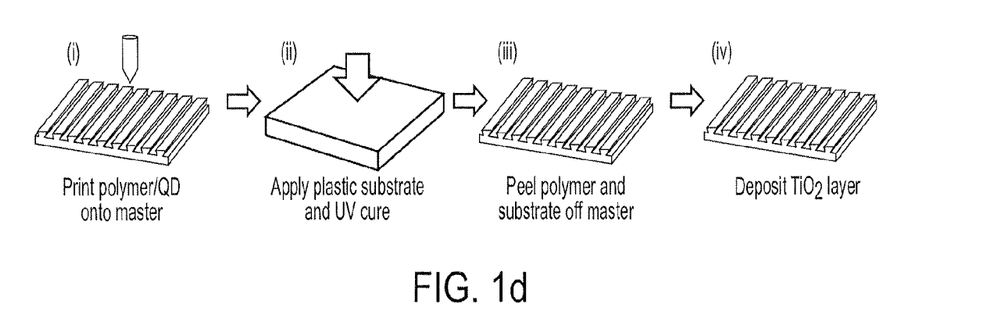
FIG. 1(d) shows schematically a referred process to produce a device of the invention.

The polymer grating is formed by E-jet printing the solution over the silicon master, followed by curing the polymer layer (FIG. 1(d)). The printing used a gold/palladium (Au/Pd) coated nozzle dipped in a hydrophobic coating of 0.1% (by weight) dimethylformamide with a tip diameter of 5 μm, which allowed the quantum dot—LMA solution to be printed continuously without clogging the nozzle. The printing voltage and speed were optimized to form continuous lines on the PC substrate. By pre-programming the printing process through the E-jet interface, specific areas and sizes could be printed automatically.

After printing, the substrate was transferred into an argon atmosphere glove box and cured under UV illumination for 30 min. AFM measurements (Digital Instruments Dimension 3000 Atomic Force Microscope) show that the thickness of this layer is 600 nm, which is a significant decrease in thickness as compared to the 8 μm thick layer produced by spin-casting the same material (Dektak 3030 profilometer). Another layer of LMA solution, this time without any quantum dots, was drop-cast on the substrate and covered with a Grafix acetate substrate. After the second LMA layer was fully cured, the two-layer film was peeled away from the master. Finally, a layer of high refractive index TiO$_2$ was deposited over the patterned polymer-quantum dot structure, which converts the structure into a photonic crystal.

EXAMPLE 2

The performance of the device produced in Example 1 above was characterized using the collimated output of a UV LED (Thor Labs, Ultra Bright Deep Violet LED) with a center wavelength of λ=375 nm and a 20 nm full-width half-maximum as the excitation source. The UV emission was also passed through a 350<λ<390 nm bandpass filter to ensure that only the UV wavelengths interacted with the quantum dots in the device. The device output was measured by mounting the PC device on a motorized rotation stage with control of the orientation in 0.1° steps, allowing the output emission of the device to be measured over a viewing angle range of ±20°. The output was passed through a UV filter and collected by a collimating lens on an optical fiber connected to a USB2000+ Ocean Optics spectrometer. The stage position and collected emission data were controlled by a custom LabView OmniDriver software interface.

The same setup was also used to measure the transmission through the device by replacing the UV LED with a collimated, unpolarized broadband tungsten-halogen lamp as the source. In this case, the quantum dots are not excited, and the photonic band diagram of the photonic crystal can be determined instead. The same angle range was tested to compare the band diagram with the measured emission.

Figure 3:
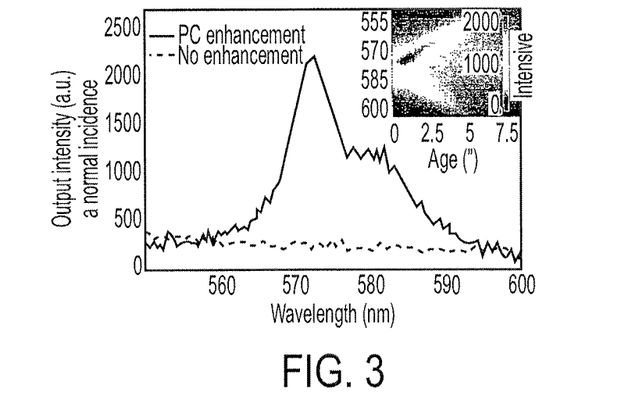
FIG. 3 shows angle dependence of the quantum dot emission and enhancement from a photonic crystal.

The device was initially measured after the grating was fabricated with the quantum dot doped polymer, but before the TiO$_2$ deposition, to provide a baseline measurement for the output emission intensity. The measurements were repeated after the TiO$_2$ deposition. As shown in FIG. 3, at the center wavelength of λ=575 nm, there is an 8× enhancement in the output intensity. The inset shows a tight angular dependence of ±2.5° for the PC enhancement at the target wavelength.

Figure 4A:
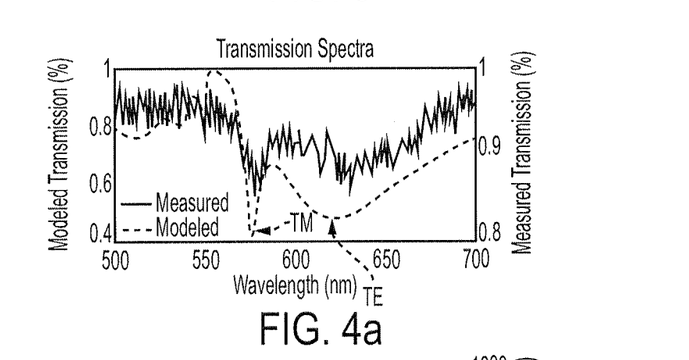
Figure 4B:
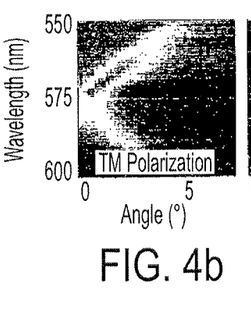
Figure 4C:
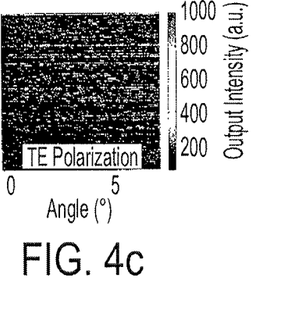
FIG. 4(c) shows the molded and measured transmission spectra of the photonic crystal.

The enhanced emission is also polarized. FIGS. 4(a) and 4(b) show the device output with the inclusion of a polarizer between the device and the measurement collection optics. The measured emission is shown for both the TM and TE polarizations in FIG. 4(a) and FIG. 4(b), respectively. The TM output is 5× greater than the TE, and the TE output is comparable to the noise floor of the measurement system. FIG. 4(c) shows the modeled and measured transmission spectra of the device. The measured transmission shows dips in the unpolarized transmission spectra occur at wavelengths of λ=575 nm and 620 nm, as predicted by the model for the TM and TE modes, respectively. However, the measured transmission values are significantly larger than those predicted by the model. This is because the active device region is only 7.75% of the total substrate area that was measured, and the large inactive region contributed a significantly higher transmission to the measurement than occurs for the photonic crystal alone.

EXAMPLE 3

Figure 5:
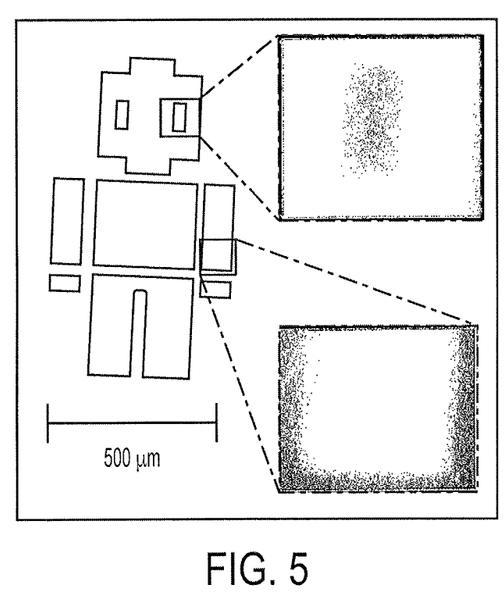
FIG. 5 shows a fluorescence microscope image of an E-jet printed device of the invention.

A fluorescence microscope image was taken of the E-jet printed device of Example 1. The image is shown in FIG. 5 where the top inset shows the sharpness of the edges printed by the system. The bottom inset shows a duller edge where the printing was not perfectly aligned with the replica molding master. The fainter regions are due to quantum dot emission occurring in a planar region with no photonic crystal structure to provide enhancement.

All documents mentioned herein are fully incorporated herein by reference in their entirety.

What is claimed is:

1. A structure comprising:
   (a) a one-dimensional periodic plurality of layers, wherein at least two of the layers have a refractive index differential sufficient to provide effective contrast; and (b) one or more light-emitting nanostructure materials effectively positioned with respect to the refractive index differential interface, wherein the structure provides a polarized output emission.

2. The structure of claim 1 comprising:
a) a polymeric layer disposed on a substrate, the polymeric layer comprising one or more polymers, the polymeric layer having a patterned surface comprising a plurality of recesses;
b) a layer of a material having a higher index of refraction than the polymeric layer disposed over the patterned surface of the polymeric layer.

3. The structure of claim 2 wherein the polymeric layer comprises the one or more light-emitting nanostructure materials.

4. The structure of claim 2 further comprising a further layer above the higher index of refraction material layer.

5. The structure of claim 4 wherein the further layer comprises the one or more light-emitting nanostructure materials.

6. The structure of claim 1 wherein the one or more light-emitting nanostructure materials are configured in one or more linear grating.

7. The structure of claim 1 wherein the structure comprises two or more photonic crystal regions.

8. The structure of claim 1 wherein the higher index of refraction material layer comprises the one or more light-emitting nanostructure materials.

9. The structure of claim 1 wherein the one or more light-emitting nanostructure materials comprise quantum dots, fluorescent dyes, or phosphors.

10. The structure of claim 1 wherein the structure provides a light-emitting device, a photodetector device, a chemical sensor, a photovoltaic device, a fluorescent backlight film, a diode, a transistor, or a biologically active surface.

11. The structure of claim 1 wherein the structure provides an output emission that is increased relative to a control structure.

12. The structure of claim 1 wherein the structure provides a linearly polarized output.

13. The structure of claim 1 wherein the structure provides a circular or elliptically polarized output.

14. A method of forming a photonic crystal system with a polarized output emission, comprising:
applying on a substrate surface a polymeric layer comprising one or more polymer and a plurality of light-emitting nanocrystals;
disposing a layer of a material having a higher index of refraction than the polymeric layer over the polymeric layer to provide a photonic crystal system,
wherein the photonic crystal system provides a polarized output emission.

15. The method of claim 14 further comprising removing the polymeric layer from the substrate and then transferring the removed polymeric layer to a distinct substrate.

16. The method of claim 14 further comprising curing the polymeric layer.

17. The method of claim 14 wherein the polymeric layer is applied by electrohydrodynamic-jet printing.

* * * * *